United States Patent
Strauch

(10) Patent No.: US 7,282,096 B2
(45) Date of Patent: Oct. 16, 2007

(54) ARRANGEMENT COMPRISING A SUPPORT BODY AND A SUBSTRATE HOLDER WHICH IS DRIVEN IN ROTATION AND GAS-SUPPORTED THEREON

(75) Inventor: Gerhard Karl Strauch, Aachen (DE)

(73) Assignee: Aixtron AG (DE)

( * ) Notice: Subject to any disclaimer, the term of this patent is extended or adjusted under 35 U.S.C. 154(b) by 337 days.

(21) Appl. No.: 10/722,848

(22) Filed: Nov. 26, 2003

(65) Prior Publication Data

US 2004/0154544 A1    Aug. 12, 2004

Related U.S. Application Data

(63) Continuation of application No. PCT/EP02/04406, filed on Apr. 22, 2002.

(51) Int. Cl.
   *C23C 16/00* (2006.01)
(52) U.S. Cl. .................... 118/728; 118/500; 269/21
(58) Field of Classification Search ............ 118/730, 118/340, 724, 728, 500; 406/87, 88, 92; 219/652; 392/418; 156/345.55, 345; 269/21
See application file for complete search history.

(56) References Cited

U.S. PATENT DOCUMENTS

| | | | |
|---|---|---|---|
| 4,860,687 A | 8/1989 | Frijlink ................. | 118/500 |
| 5,270,262 A * | 12/1993 | Switky et al. ............ | 29/827 |
| 5,527,393 A * | 6/1996 | Sato et al. ............... | 118/725 |
| 5,840,125 A | 11/1998 | Gronet et al. ............. | 118/730 |
| 6,005,226 A * | 12/1999 | Aschner et al. ........... | 219/390 |
| 6,449,428 B2 * | 9/2002 | Aschner et al. ........... | 392/418 |
| 6,797,069 B2 * | 9/2004 | Paisley et al. ............ | 118/730 |

FOREIGN PATENT DOCUMENTS

| | | |
|---|---|---|
| JP | 62177912 A | 8/1987 |
| WO | WO 01/99257 * | 6/2001 |

* cited by examiner

*Primary Examiner*—Sylvia MacArthur
(74) *Attorney, Agent, or Firm*—St. Onge Steward Johnston & Reens LLC

(57) ABSTRACT

The invention relates to an arrangement comprising a support body with a substrate holder, mounted thereon on a gas bearing with rotating drive. The gas bearing and the rotating drive are formed by gas flowing in through nozzles arranged in the separating gaps between support body and substrate. The support body and the substrate holder are embodied as rings, whereby the rings lie on each other in a self-centering manner and the one ring comprises a ring bead extending into a ring recess on the other ring.

20 Claims, 3 Drawing Sheets

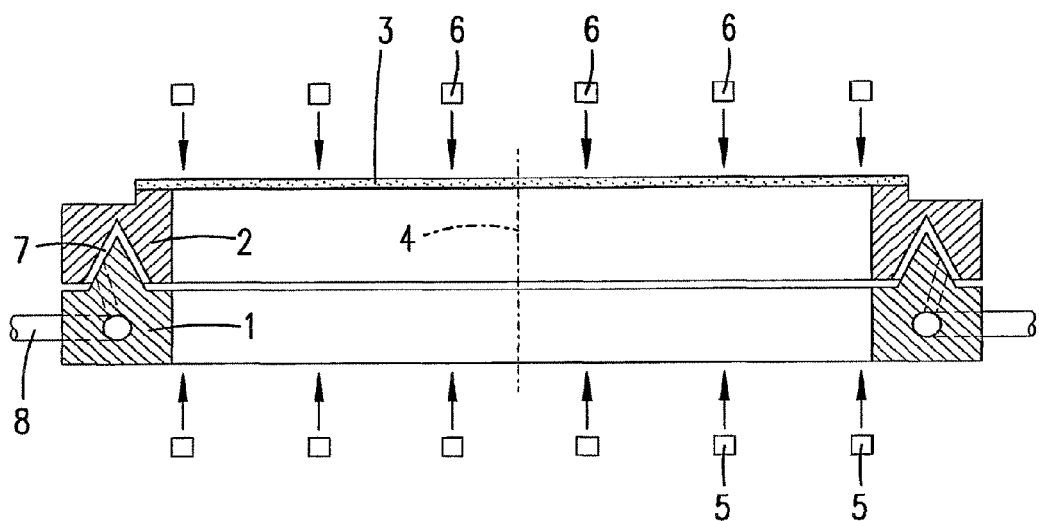
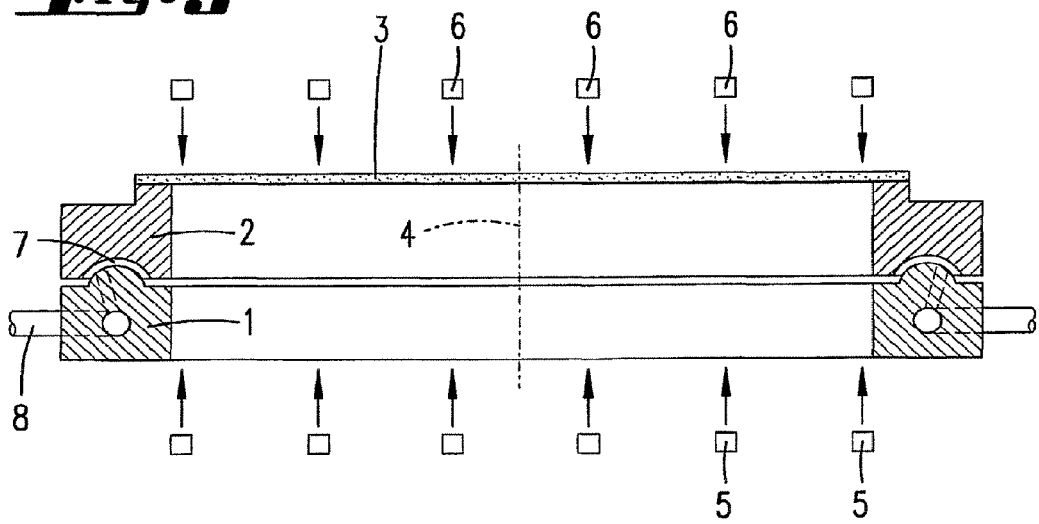

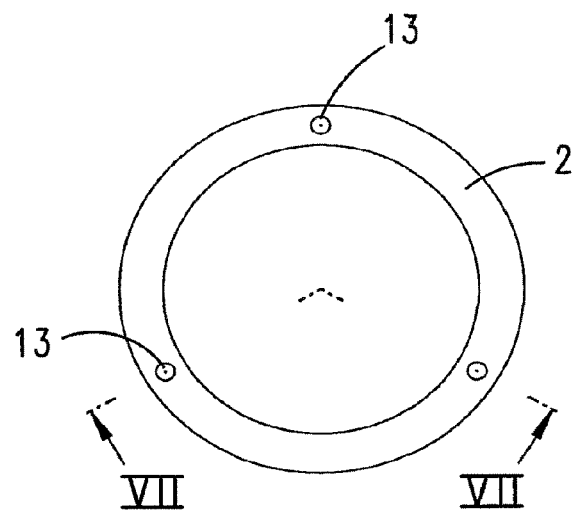
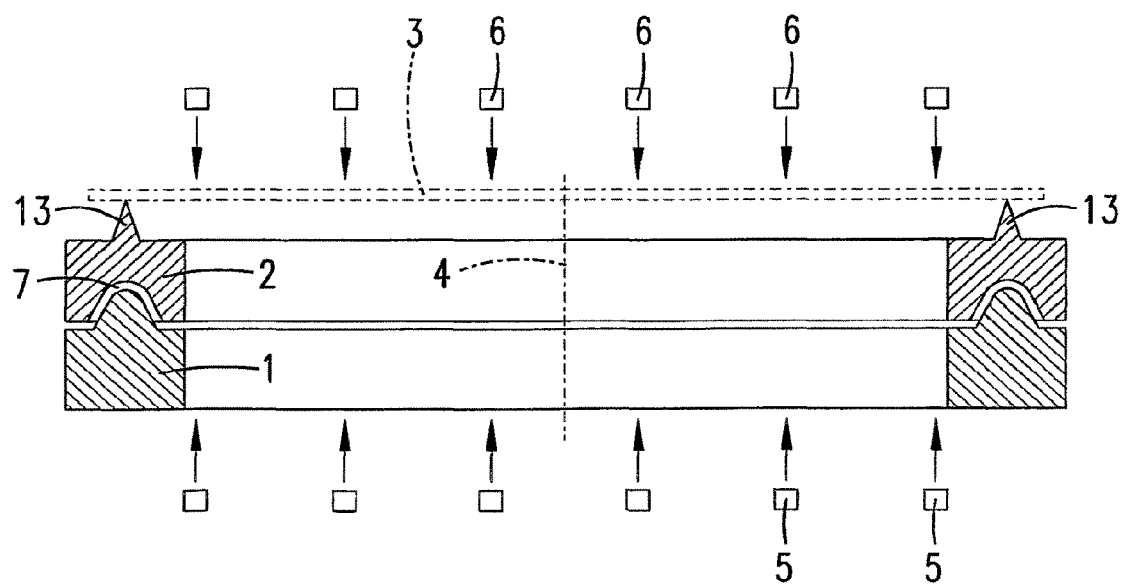

ARRANGEMENT COMPRISING A SUPPORT BODY AND A SUBSTRATE HOLDER WHICH IS DRIVEN IN ROTATION AND GAS-SUPPORTED THEREON

This application is a continuation of pending International Patent Application No. PCT/EP02/04406 filed Apr. 22, 2002, which designates the United States and claims priority of pending German Application Nos. 101 26 274.4 filed May 29, 2001 and 101 35 151.8 filed Jul. 19, 2001.

FIELD OF THE INVENTION

The invention relates to an arrangement comprising a support body and a substrate holder which is gas-supported thereon and driven in rotation, the gas bearing and the rotary drive being formed by means of gas flowing into the separating gap between support body and substrate from nozzles.

An arrangement of this type is already known from U.S. Pat. No. 4,860,687. In that document, the support body comprises a plate out of which a centering pin protrudes. Grooves into which nozzles through which a gas enters the arcuate grooves open out are disposed helically around the centering pin. A plate which is in the form of a circular disk and is gas-supported by the gas streams emerging from the nozzles rests on the pin. The gas streams diverted into the arcuate grooves entrain the plate in the direction of flow, so that a viscous rotary drive is produced.

The substrate holder and the plate resting thereon are heated from below, for example by means of high frequency.

The invention is based on the object of providing a device by means of which a rapid heat treatment of a substrate resting on a substrate holder can be carried out.

This object is firstly and substantially achieved by the subject matter of claim 1, in which the support body and the substrate holder are formed as rings. The subject matter given in the further claims relates both to advantageous refinements of the subject matter of claim 1 and also, at the same time, to stand-alone proposed technical solutions which are independent of the subject matter of claim 1 and of the object outlined above. It is provided therein that the rings rest on top of one another in self-centering fashion. For this purpose, one ring may have a ring bead which engages into a ring recess in the other ring. The ring bead may be formed as a wedge which engages in a corresponding mating wedge surface of the other ring. Now, only the edge of the substrate rests on the edge of the rotationally driven ring. There is no need for any further centering or bearing means. In particular, the location at which the imaginary axis of rotation is located can be selected as desired. This means that the substrate resting on the rotating ring can be heated from below through the ring, for example by means of infrared radiation. At the same time, the substrate can be irradiated from above, so that the homogeneity with which the heat is applied is improved. As in the prior art, the nozzles open out into grooves, in particular arcuate grooves, in a manner which is known per se. Unlike in the prior art, however, the arcuate grooves are also configured in such a way that opposite flows can be formed. As a result, the rotationally driven ring can be rotated in different directions of rotation. However, it may also be decelerated by oppositely directed flow. The deceleration in this case takes place exclusively by means of the gas cushion, which has a thermally insulating action between the two rings. This leads to a thermally insulated stationary position of the rotationally driveable ring. The deceleration to the stationary position, like the rotational drive, takes place without particles, i.e. without solid-state friction. The rings may consist of quartz or of ceramic. In particular the lower ring consists of this material. The arrangement according to the invention is in particular part of a device for the heat treatment of semiconductor wafers during the process of producing semiconductor components. The arrangement serves in particular to support a substrate which is in the form of a circular disk in such a manner that its edge is supported from below, and in this context the bearing should as far as possible be thermally insulated from the remainder of the device. According to the invention, these objectives can be fulfilled in this way. Moreover, the rotation ensures that the heat treatment takes place homogeneously and in a rotationally symmetrical fashion. This ensures a high level of homogeneity even with high scaling. In one refinement of the invention, it is possible for the edge of the substrate to rest only on needle-like tips of the rotationally driven ring. This minimizes the dissipation of heat or the supply of heat from or to the substrate by way of heat conduction through surface contact. This too promotes the homogeneity of the heat treatment.

BRIEF DESCRIPTION OF THE DRAWINGS

An exemplary embodiment of the invention is explained below with reference to appended drawings, in which:

FIG. 4 shows an illustration corresponding to FIG. 2 of a second embodiment, FIG. 5 shows an illustration corresponding to FIG. 2 of a third embodiment, FIG. 6 shows a plan view of the rotationally driven ring, without a substrate resting on it, of a further exemplary embodiment, and FIG. 7 shows a section on line VII-VII in FIG. 6.

DETAILED DESCRIPTION OF THE DRAWINGS

Figure 1:
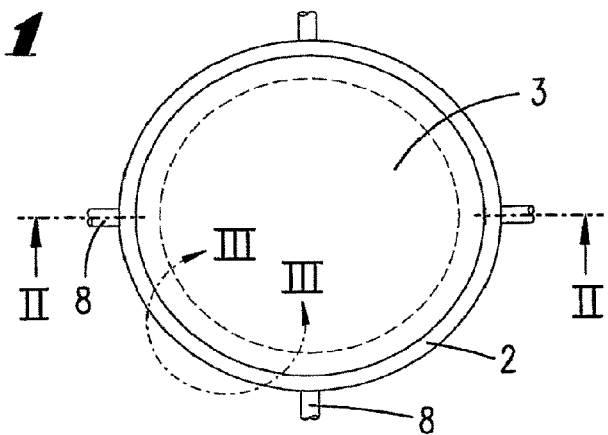
FIG. 1 shows the arrangement in plan view.

The arrangement which is diagrammatically depicted in the figures is part of a device for the heat treatment of semiconductor wafers. This treatment can take place under an inert gas atmosphere. For this purpose, the wafer 3, which is to be referred to as the substrate, is heated from above by means of lamps. The infrared light 6 emanating from the lamps heats the top side of the substrate. The substrate is also heated from below by means of lamps. The infrared light 5 emanating from these lamps heats the substrate 3 from below.

The arrangement has a stationary ring 1, which can be made from quartz or from ceramic. A rotationally driven ring 2 rests on the stationary ring 1. The two rings are of approximately the same size.

The edge of the substrate 3 rests on the rotationally driven ring 2. Accordingly, the substrate 3 rests on the substrate holder 2 in such a manner as to form a hollow.

The parting plane which is located between the stationary ring 1 and the rotating ring 2 forms a ring bead. This ring bead is preferably associated with the stationary ring 1. The ring bead projects into a correspondingly negative ring recess in the rotating ring 2, so that positively locking centering of the two rings on top of one another is ensured.

In the exemplary embodiment illustrated in FIG. 4, the ring bead is in the shape of a roof. The corresponding groove is in the shape of a notch.

Figure 2:
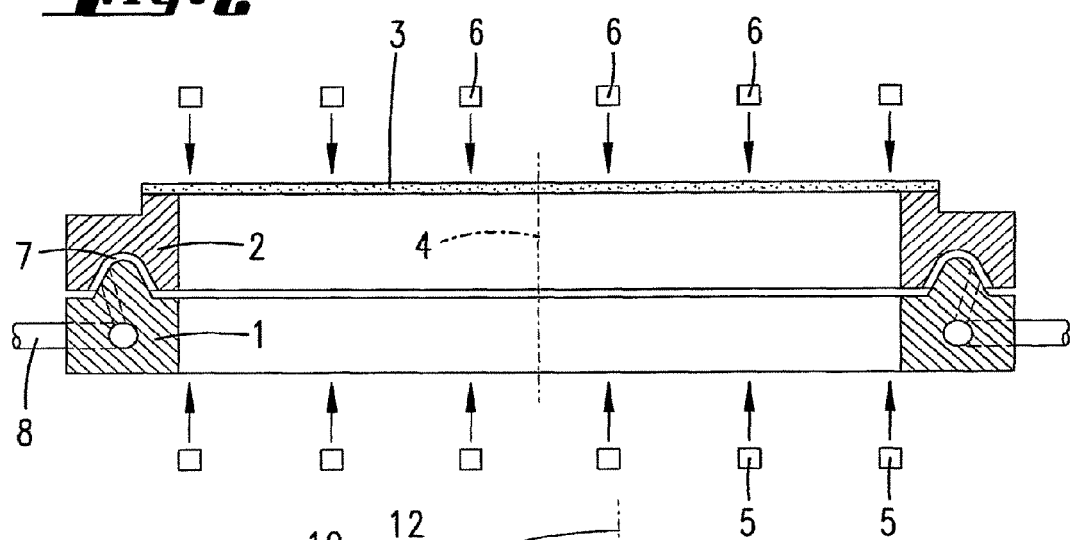
FIG. 2 shows a section on line II-II in FIG. 1.

In the exemplary embodiment illustrated in FIG. 5, the bead, as also in the exemplary embodiment illustrated in FIG. 2, is curved in cross section. On account of the thermal expansion of the rotating ring 2, the groove in the ring 2 associated with the bead is arranged offset radially inward.

Gas feed lines 8 which open out into nozzles 11 and 12 are located in the stationary ring 1. The nozzles 11 and 12 open out in the region of the parting plane between the two rings 1, 2. On account of the gas emerging from the nozzles 11, 12, a gap 7 is formed between the two rings 1, 2. This gap 7 forms a gas bearing for the rotating ring 1.

Figure 3:
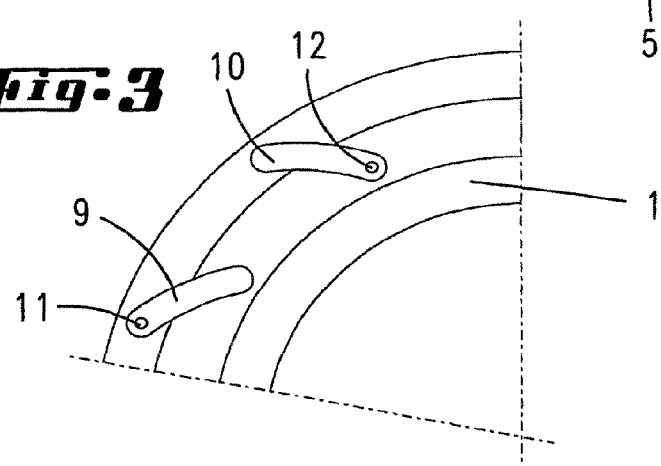
FIG. 3 shows an enlarged excerpt of the static ring in the region III indicated in FIG. 1.

As can be seen in particular from FIG. 3, the nozzles 11, 12 open out into arcuate grooves 9, 10. These arcuate grooves 9, 10 impart a preferred direction of flow in the direction of the groove profile to the gas emerging from the nozzles 11, 12. The two directions of flow in the grooves 10 and 11 illustrated in FIG. 3 are directed oppositely to one another. On account of a viscous coupling of the gas stream which flows through the grooves 10, 11, the rotating ring 2 is entrained in rotation.

In each case a multiplicity of arcuate grooves 9, 10 are provided, with the grooves 9, 10 alternating with a uniform distribution in the ring circumscribing direction. If a gas stream flows only through the grooves 9, the rotating ring is pulled along in the clockwise direction. On the other hand, if a gas stream flows only through the arcuate grooves 10, the rotating ring 2 is entrained in the counterclockwise direction. Changing the direction of flow makes it possible to decelerate a ring 1 which has been set in rotation. If a gas stream is introduced into the respective grooves 9, 10 through both nozzles 11, 12, the two torques cancel one another out, so that the gas bearing can also be operated without rotation.

The rotational drive and the deceleration of the ring 2 take place in thermally insulated fashion with respect to the ring 1. In the decelerated position, balancing of the two gas streams makes it possible to achieve a thermally insulated stationary position.

The material used for the rotationally driven ring 2 is preferably a material which has a low heat absorption. The material used in particular has a low infrared absorption.

In the variant illustrated in FIGS. 6 and 7, the substrate 3 rests only on three needle-like projections 13 which are associated with the rotationally driven ring 2. This minimizes the surface contact between substrate 3 and rotationally driven ring 2, leading to a further improvement in the thermally insulated bearing of the substrate 3.

All features disclosed are (inherently) pertinent to the invention. The disclosure content of the associated/appended priority documents (copy of the prior application) is hereby incorporated in its entirety in the disclosure of the application, partly with a view to incorporating features of these documents in claims of the present application.

What is claimed is:

1. Arrangement comprising a support body and a substrate holder which is supported thereon and driven in rotation, a gas bearing and a rotary drive being formed by means of gas flowing into the separating gap between support body and substrate holder from nozzles disposed in the support body which open out into the separating gap, characterized in that the support body and the substrate holder are formed as rings, and the support body includes a ring bead which projects into a ring recess in the substrate holder.

2. Arrangement according to claim 1, characterized in that the rings rest on top of one another in a self-centering fashion.

3. Arrangement according to claim 1, characterized in that the substrate is supported on the ring which is driven in rotation only by means of its edge.

4. Arrangement according to claim 1, characterized in that the substrate rests on the ring with minimal contact, preferably only on the tips of needle-like protuberances.

5. Arrangement according to claim 1, characterized in that the nozzles open out into arcuate grooves.

6. Arrangement according to claim 1, characterized in that the nozzles open out into arcuate grooves with alternating preferred directions of gas flow streams, said streams flowing in opposite directions.

7. Arrangement according to claim 1, characterized by oppositely directed driving gas streams for rotationally bearing and rotationally driving the rotating ring.

8. Arrangement according to claim 1, characterized in that the substrate is radiation-heated from below through the rings.

9. Arrangement according to claim 1, characterized in that the support body and/or the substrate holder consist of quartz or ceramic material.

10. Arrangement according to claim 9, characterized in that the rotationally driven ring has a low heat absorption.

11. Arrangement according to claim 10, characterized in that the arrangement is part of a device for the heat treatment of semiconductor wafers.

12. Arrangement according to claim 1, wherein the nozzles open out into the separating gap and open out into grooves.

13. Arrangement according to claim 12, wherein said grooves are formed in the mating surface of said support body opposite the mating surface of said substrate holder.

14. Arrangement according to claim 13, wherein each nozzle opens out into the proximal end of a corresponding groove.

15. Arrangement according to claim 14, wherein gas emerging from each nozzle flows in a preferred direction from the proximal end of each groove to the distal end of each groove.

16. Arrangement according to claim 15, wherein said grooves are distributed on the surface of said support body such that there are alternating preferred directions of gas flows.

17. Arrangement according to claim 16, wherein said preferred directions are opposite directions.

18. Arrangement according to claim 17, wherein a portion of said grooves are formed in the surface of said ring bead.

19. Arrangement according to claim 18, wherein said grooves are arcuate grooves.

20. Device for the in particular rapid heat treatment of flat objects, having a support body and a substrate holder which is supported thereby in such a manner that it can be driven in rotation and on which the flat object can be placed, it being possible to produce a gas cushion beneath the substrate holder by means of gas which emerges from nozzles disposed in the support body which open out into a separating gap between support body and holding body, on which gas cushion the substrate holder rests in such a manner that it is driven in rotation by directed gas streams, characterized in that the support body and the substrate holder are formed as rings, the support body includes a ring bead which projects into a ring recess in the substrate holder, the support body and/or the substrate holder consist of quartz or ceramic material, the rotationally driven ring has a low heat absorption, and the arrangement is part of a device for the heat treatment of semiconductor wafers.

* * * * *